(12) United States Patent
Tsau

(10) Patent No.: US 9,755,039 B2  
(45) Date of Patent: Sep. 5, 2017

(54) SEMICONDUCTOR DEVICE HAVING A METAL GATE ELECTRODE STACK

(75) Inventor: Hsueh Wen Tsau, Zhuan Township (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 83 days.

(21) Appl. No.: 13/192,718

(22) Filed: Jul. 28, 2011

(65) Prior Publication Data
US 2013/0026578 A1    Jan. 31, 2013

(51) Int. Cl.
| | | |
|---|---|---|
| H01L 21/70 | (2006.01) | |
| H01L 29/49 | (2006.01) | |
| H01L 29/66 | (2006.01) | |
| H01L 29/78 | (2006.01) | |
| H01L 21/8238 | (2006.01) | |
| H01L 29/51 | (2006.01) | |

(52) U.S. Cl.
CPC .. H01L 29/4983 (2013.01); H01L 21/823842 (2013.01); H01L 29/4966 (2013.01); H01L 29/66545 (2013.01); H01L 29/7833 (2013.01); H01L 29/517 (2013.01)

(58) Field of Classification Search
CPC ............. H01L 29/66545; H01L 29/517; H01L 2924/00; H01L 21/823842; H01L 29/4966; H01L 29/4958; H01L 21/76846
USPC .... 257/407, E29.158, E29.159, E29.16, 501
See application file for complete search history.

(56) References Cited

U.S. PATENT DOCUMENTS

| | | | |
|---|---|---|---|
| 6,077,780 A | 6/2000 | Dubin | |
| 6,337,151 B1 * | 1/2002 | Uzoh | C23C 14/0084 257/485 |
| 6,368,923 B1 * | 4/2002 | Huang | 438/275 |
| 6,465,309 B1 * | 10/2002 | Xiang et al. | 438/299 |
| 8,148,257 B1 * | 4/2012 | Barth et al. | 438/614 |
| 2002/0127844 A1 * | 9/2002 | Grill et al. | 438/622 |
| 2005/0087879 A1 * | 4/2005 | Won et al. | 257/758 |
| 2006/0051924 A1 | 3/2006 | Doczy et al. | |
| 2006/0081939 A1 * | 4/2006 | Akasaka et al. | 257/371 |
| 2006/0284271 A1 * | 12/2006 | Doyle et al. | 257/410 |

(Continued)

FOREIGN PATENT DOCUMENTS

CN    1846313    10/2006

OTHER PUBLICATIONS

Notice of Allowance dated Oct. 18, 2013 and English translation from corresponding application No. KR 10-2011-0099370.

(Continued)

Primary Examiner — David Chen  
(74) Attorney, Agent, or Firm — Hauptman Ham, LLP (57) ABSTRACT

A semiconductor device includes a substrate, a gate dielectric layer on the substrate, and a gate electrode stack on the gate dielectric layer. The gate electrode stack includes a metal filling line, a wetting layer, a metal diffusion blocking layer, and a work function layer. The wetting layer is in contact with a sidewall and a bottom surface of the metal filling line. The metal diffusion blocking layer is in contact with the wetting layer and covers the sidewall and the bottom surface of the metal filling line with the wetting layer therebetween. The work function layer covers the sidewall and the bottom surface of the metal filling line with the wetting layer and the metal diffusion blocking layer therebetween.

17 Claims, 11 Drawing Sheets

(56) References Cited

U.S. PATENT DOCUMENTS

| | | | |
|---|---|---|---|
| 2007/0075427 A1* | 4/2007 | Lavoie | H01L 21/28562 257/750 |
| 2009/0289334 A1* | 11/2009 | Rachmady et al. | 257/649 |
| 2010/0052075 A1* | 3/2010 | Yeh et al. | 257/410 |
| 2010/0081262 A1 | 4/2010 | Lim et al. | |
| 2010/0216287 A1 | 8/2010 | Tsai et al. | |
| 2010/0328022 A1* | 12/2010 | Fan | H01L 27/0629 338/309 |
| 2011/0006354 A1 | 1/2011 | Jangjian et al. | |
| 2011/0241130 A1* | 10/2011 | Chan | H01L 21/28079 257/410 |
| 2011/0298062 A1* | 12/2011 | Ganguli et al. | 257/410 |
| 2012/0248507 A1* | 10/2012 | Liu et al. | 257/288 |

OTHER PUBLICATIONS

Office Action dated May 9, 2014 from corresponding application No. TW 100139726.

* cited by examiner

SEMICONDUCTOR DEVICE HAVING A METAL GATE ELECTRODE STACK

TECHNICAL FIELD

The disclosure relates to semiconductor devices and methods of manufacturing the same.

BACKGROUND

In a semiconductor device such as metal-oxide-semiconductor field-effect transistors (MOSFETs), metals have been introduced as gate electrode materials in order to avoid the polysilicon depletion effect in a doped polysilicon gate electrode. A replacement-gate (RPG) process has been introduced for fabricating a metal gate electrode. As device dimensions shrink and the gate length is scaled down, it is difficult to form a void-free metal gate structure in the RPG process.

DETAILED DESCRIPTION

It is to be understood that the following disclosure provides many different embodiments or examples, for implementing different features of various embodiments. Specific examples of components and arrangements are described below to simplify the present disclosure. The present disclosure may, however, be embodied in many different forms and should not be construed as being limited to the embodiments set forth herein; rather, these embodiments are provided so that this description will be thorough and complete, and will fully convey the present disclosure to those of ordinary skill in the art. It will be apparent, however, that one or more embodiments may be practiced without these specific details.

In the drawings, the thickness and width of layers and regions are exaggerated for clarity. Like reference numerals in the drawings denote like elements. The elements and regions illustrated in the figures are schematic in nature, and thus relative sizes or intervals illustrated in the figures are not intended to limit the scope of the present disclosure.

Figure 1:
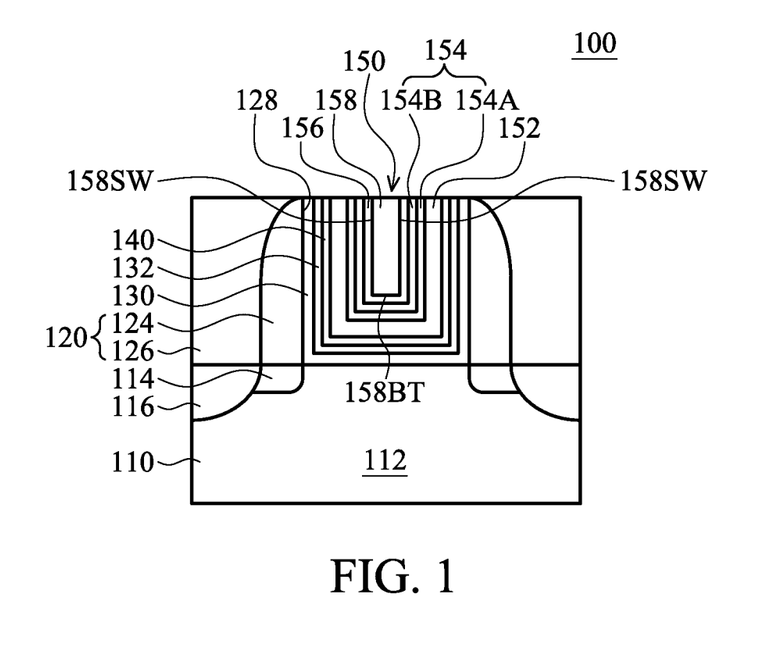
FIG. 1 is a cross-sectional view of a semiconductor device having a metal gate electrode stack according to an embodiment.

FIG. 1 is a cross-sectional view of a semiconductor device 100 according to an embodiment of the present disclosure. The semiconductor device 100 comprises a substrate 110 having an active area 112. Lightly doped drain (LDD) regions 114 and source/drain regions 116 are formed in the active area 112 of the substrate 110. An inter-layer dielectric pattern 120 is formed on the active area 112 of the substrate 110. The inter-layer dielectric pattern 120 includes insulating spacers 124 and insulating patterns 126. The inter-layer dielectric pattern 120 defines a gate trench 128 formed through the inter-layer dielectric pattern 120 on the active area 112 of the substrate 110. In some embodiments, the insulating spacers 124 include an oxide layer, a nitride layer, or a combination thereof. In some embodiments, the insulating patterns 126 include a silicon oxide layer or an insulating layer having low dielectric constant (low-k) dielectric characteristics.

A gate dielectric layer 130 is formed on and contacting a top surface of the active area 112 and sidewalls of the inter-layer dielectric pattern 120. In one or more embodiments, the gate dielectric layer 130 is formed of at least one of high-k dielectric materials, silicon oxide, silicon nitride, or silicon oxynitride. The high-k dielectric materials include materials having a dielectric constant greater than silicon dioxide. The high-k dielectric materials suitable for the gate dielectric layer 130 include hafnium oxide, hafnium oxide doped with Zr, aluminum oxide, titanium oxide, zirconium oxide, indium oxide, lanthanum oxide, yttrium oxide, hafnium silicon oxide, hafnium aluminum oxide, aluminum silicon oxide, titanium silicon oxide, zirconium silicon oxide, strontium oxide, strontium titanium oxide, yttrium silicon oxide, and combinations thereof, but are not limited by the above-mentioned materials. In some embodiments, the gate dielectric layer 130 has a stack structure of two or more dielectric layers. In one or more embodiments, the gate dielectric layer 130 has a stack structure of an interfacial dielectric layer, such as a silicon oxide layer, and a high-k material layer overlying the interfacial dielectric layer. In some embodiments, the gate dielectric layer 130 has a thickness in the range of about 1 to 4 nanometers (nm).

A capping layer 132 and a barrier layer 140 are sequentially formed on the gate dielectric layer 130. In one or more embodiments, the capping layer 132 and the barrier layer 140 are optional. A metal gate electrode stack 150 fills the remainder of the gate trench 128 on the barrier layer 140. The metal gate electrode stack 150 includes a work function layer 152, a metal diffusion blocking layer 154, a wetting layer 156, and a metal filling line 158 sequentially formed on the barrier layer 140.

The metal filling line 158 is composed of a line-shaped metal layer extending along and within the gate trench 128. The metal filling line 158 has sidewalls 158SW facing the sidewalls of the inter-layer dielectric pattern 120 and a bottom surface 158BT facing the active area 112. The wetting layer 156 is in contact with at least a portion of the sidewalls 158SW and at least a portion of the bottom surface 158BT of the metal filling line 158. The metal diffusion blocking layer 154 is in contact with at least a portion of the wetting layer 156 and covers at least a portion of the sidewalls 158SW and at least a portion of the bottom surface 158BT of the metal filling line 158 with the wetting layer 156 therebetween. The work function layer 152 covers the sidewalls 158SW and the bottom surface 158BT of the metal filling line 158 with the wetting layer 156 and the metal diffusion blocking layer 154 therebetween.

In one or more embodiments, the wetting layer 156 extends to continuously or intermittently cover the metal filling line 158 along the sidewalls 158SW and the bottom surface 158BT thereof. In some embodiments, the metal diffusion blocking layer 154 extends to continuously or intermittently cover the wetting layer 156 along the sidewalls 158SW and the bottom surface 158BT of the metal filling line 158. In some embodiments, a top portion of the sidewalls 158SW or the immediate vicinity of a top surface of the metal filling line 158 is covered by the metal diffusion blocking layer 154 and/or the wetting layer 156.

The metal filling line 158 is positioned in the middle with regard to distance from the sidewalls of the inter-layer dielectric pattern 120 at the entrance of the gate trench 128. In some embodiments, the metal filling line 158 comprises at least one of aluminum (Al), copper (Cu), AlCu, or tungsten (W), but is not limited by the above-mentioned materials.

As device dimensions shrink and the gate length becomes scaled down, the phenomenon of electromigration in the metal filling line 158 can cause voids in the vicinity of the metal filling line 158 within the gate trench 128. The voids generated in a gate electrode may deteriorate an electrical characteristic and reliability of the gate electrode, increase the resistance of the gate electrode, and/or weaken the structural integrity of the gate electrode. Electromigration is the movement or diffusion of atoms in a metal line, for example, caused by current flow through the metal line. Diffusion of metal ions from the sidewalls 158SW and the bottom surface 158BT of the metal filling line 158 may lead to voids in the metal gate electrode stack 150. The wetting layer 156 and the metal diffusion blocking layer 154 are formed to cover the sidewalls 158SW and the bottom surface 158BT of the metal filling line 158. Therefore, the wetting layer 156 and the metal diffusion blocking layer 154 inhibit diffusion of metal ions from the metal filling line 158 to adjacent layers, thereby inhibiting the formation of the undesirable voids in the vicinity of the metal filling line 158 of the metal gate electrode stack 150.

Further, the wetting layer 156 contacts with the sidewalls 158SW and the bottom surface 158BT of the metal filling line 158 between the metal filling line 158 and the metal diffusion blocking layer 154 as depicted in FIG. 1. In one or more embodiments, the wetting layer 156 is a metal layer which forms bonds to the metal filling line 158. The wetting layer 156 enables the metal filling line 158 to have improved filling characteristics in the gate trench 128, and therefore results in a continuous void-free metal gate electrode stack by facilitating filling of the gate trench 128 with the metal such as Al, Cu, or alloys thereof for forming the metal filling line 158 without leaving unfilled voids therein. The wetting layer 156 includes at least one of cobalt (Co), Ti, or Ta. In some embodiments, the wetting layer 156 has a thickness in the range of about 1 to 5 nm.

The metal diffusion blocking layer 154 is in contact with the wetting layer 156 between the wetting layer 156 and the work function layer 152. The metal diffusion blocking layer 154 includes a metal nitride. For example, the metal diffusion blocking layer 154 includes at least one of a Ti-rich TiN layer, a TaN layer, or a TiN layer. The Ti-rich TiN layer has a relatively large content of Ti in comparison with a stoichiometric TiN layer consisting of a 1:1 mixture of Ti and N atoms. That is, the Ti-rich TiN layer has more than 50 atomic percent Ti content therein. The metal diffusion blocking layer 154 has a stack structure of a first metal nitride layer 154A and a second metal nitride layer 154B. The first metal nitride layer 154A and the second metal nitride layer 154B comprise different compositions of metal nitride from each other. For example, the metal diffusion blocking layer 154 has the first metal nitride layer 154A comprising TiN, and the second metal nitride layer 154B comprising Ti-rich TiN. Alternatively, the metal diffusion blocking layer 154 has the first metal nitride layer 154A comprising TiN, and the second metal nitride layer 154B comprising TaN. The first metal nitride layer 154A of the metal diffusion blocking layer 154 contacts with the work function layer 152. The second metal nitride layer 154B of the metal diffusion blocking layer 154 contacts with the wetting layer 156. In some embodiments, the first metal nitride layer 154A and the second metal nitride layer 154B of the metal diffusion blocking layer 154 have thicknesses in the range of about 1 to 5 nm.

The work function layer 152 is interposed between the barrier layer 140 and the metal diffusion blocking layer 154, and faces the sidewalls 158SW and the bottom surface 158BT of the metal filling line 158 within the gate trench 128. In one or more embodiments, the work function layer 152 comprises at least one of Ti, Al, TiAl, TiN, Co, WN, or TaC. For example, the work function layer 152 comprises at least one of Ti, Al, or TiAl when the metal gate electrode stack 150 is part of an N-channel MOS (NMOS) transistor of a complementary MOS (CMOS) device. Alternatively, the work function layer 152 comprises at least one of TiN, Co, WN, or TaC when the metal gate electrode stack 150 is part of a P-channel MOS (PMOS) transistor of the CMOS device. In some embodiments, the work function layer 152 has a thickness in the range of about 1 to 10 nm.

The work function layer 152 is in contact with the barrier layer 140. In some embodiments, additional one or more metallic layers (not shown) are interposed between the work function layer 152 and the barrier layer 140 such that the work function layer 152 and the barrier layer 140 are not in direct contact.

The capping layer 132 conformally covers the gate dielectric layer 130 while contacting with a top surface of the gate dielectric layer 130. In some embodiments, the capping layer 132 includes at least one of metal nitrides such as titanium nitride (TiN) and tantalum nitride (TaN), metal carbides such as tantalum carbide (TaC), and combinations thereof. In one or more embodiments, the capping layer 132 has a thickness in the range of about 1 to 5 nm.

The barrier layer 140 is interposed between the capping layer 132 and the work function layer 152. In some embodiments, the barrier layer 140 comprises at least one conductive barrier material selected from metals, metal nitrides, or metal alloys. For example, the barrier layer 140 may include at least one conductive barrier material selected from TiN, TaN, TaC, or WN, but is not limited by the above-mentioned materials. In some embodiments, the barrier layer 140 has a thickness in the range of about 1 to 5 nm.

Figure 2:
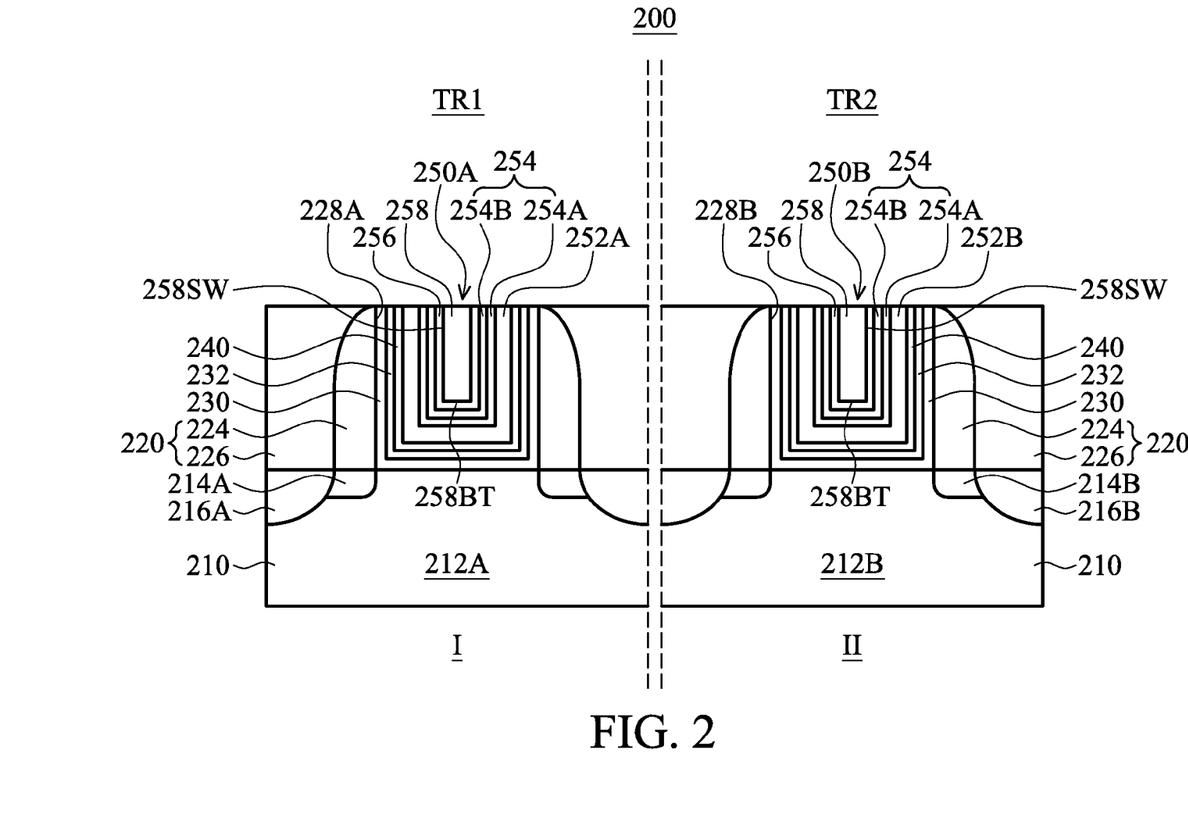
FIG. 2 is a cross-sectional view of a semiconductor device having metal gate electrode stacks according to another embodiment.

FIG. 2 is a cross-sectional view of a semiconductor device 200 according to another embodiment of the present disclosure. In some embodiments, the semiconductor device 200 can be part of CMOS transistors included in a logic device. In FIG. 2, the features are the same as or similar to like-numbered features described with respect to FIG. 1. For example, an element "2xx" in FIG. 2 is the same as or similar to an element "1xx" in FIG. 1. Therefore, the descriptions thereof will be omitted to avoid repetition.

The semiconductor device 200 comprises a substrate 210 having a first region I and a second region II as divided by dotted lines in FIG. 2. A first MOS transistor TR1 is formed in the first region I, and a second MOS transistor TR2 is formed in the second region II. In some embodiments, a first active area 212A of the first region I and a second active area 212B of the second region II are divided by an isolation layer (not shown) formed in the substrate 210.

First LDD regions 214A and first source/drain regions 216A are formed in the first active area 212A of the first region I. In one or more embodiments, the first region I is an NMOS region in which an NMOS transistor is formed as the first MOS transistor TR1. Additionally, N-type LDD regions and N-type source/drain regions are formed in the first active area 212A as the first LDD regions 214A and first source/drain regions 216A, respectively.

Second LDD regions 214B and second source/drain regions 216B are formed in the second active area 212B of the second region II. In one or more embodiments, the second region II is a PMOS region in which a PMOS transistor is formed as the second MOS transistor TR2. Also, P-type LDD regions and P-type source/drain regions are formed in the second active area 212B as the second LDD regions 214B and second source/drain regions 216B, respectively.

An inter-layer dielectric pattern 220 is formed on the first active area 212A of the first region I and on the second active area 212B of the second region II. The inter-layer dielectric pattern 220 includes insulating spacers 224 and insulating patterns 226. A first gate trench 228A and a second gate trench 228B are formed through the inter-layer dielectric pattern 220 on the first active area 212A and the second active area 212B, respectively.

A gate dielectric layer 230 is formed on the first active area 212A and the second active area 212B. Within the first gate trench 228A, the gate dielectric layer 230 is formed to cover and contact a top surface of the first active area 212A and sidewalls of the inter-layer dielectric pattern 220 defining the first gate trench 228A. Within the second gate trench 228B, the gate dielectric layer 230 is formed to cover and contact a top surface of the second active area 212B and sidewalls of the inter-layer dielectric pattern 220 defining the second gate trench 228B.

The first gate trench 228A is filled with a first metal gate electrode stack 250A over the gate dielectric layer 230 to form the first MOS transistor TR1. The first metal gate electrode stack 250A includes a first work function layer 252A, a metal diffusion blocking layer 254, a wetting layer 256, and a metal filling line 258 sequentially formed over the gate dielectric layer 230. The metal filling line 258 formed in the first region I has sidewalls 258SW facing the sidewalls of the inter-layer dielectric pattern 220 and bottom surface 258BT facing the first active area 212A. The metal diffusion blocking layer 254 has a stack structure of a first metal nitride layer 254A and a second metal nitride layer 254B. When the first MOS transistor TR1 is an NMOS transistor, the first work function layer 252A comprises one or more metals needed for a work function suitable for the NMOS transistor. In some embodiments, the first work function layer 252A comprises at least one of Ti, Al, or TiAl.

The second gate trench 228B is filled with a second metal gate electrode stack 250B over the gate dielectric layer 230 to form the second MOS transistor TR2. The second metal gate electrode stack 250B includes a second work function layer 252B, the metal diffusion blocking layer 254, the wetting layer 256, and the metal filling line 258 sequentially formed over the gate dielectric layer 230. The metal filling line 258 formed in the second region II has sidewalls 258SW facing the sidewalls of the inter-layer dielectric pattern 220 and bottom surface 258BT facing the second active area 212B. When the second MOS transistor TR2 is a PMOS transistor, the second work function layer 252B comprises one or more metals needed for a work function suitable for the PMOS transistor. In some embodiments, the second work function layer 252B comprises at least one of TiN, Co, WN, or TaC.

A capping layer 232 is interposed between the gate dielectric layer 230 and the first work function layer 252A in the first region I, and between the gate dielectric layer 230 and the second work function layer 252B in the second region II. A barrier layer 240 is formed between the capping layer 232 and the first work function layer 252A in the first region I, and between the capping layer 232 and the second work function layer 252B in the second region II.

In various embodiments of the semiconductor device 100 or 200 according to the present disclosure, the metal gate electrode stack 150, 250A, or 250B includes the metal filling line 158 or 258, the wetting layer 156 or 256 being in contact with the sidewalls 158SW or 258SW and the bottom surface 158BT or 258BT of the metal filling line 158 or 258, and the metal diffusion blocking layer 154 or 254 being in contact with the wetting layer 156 or 256 and covering the sidewalls 158SW or 258SW and the bottom surface 158BT or 258BT of the metal filling line 158 or 258 with the wetting layer 156 or 256 therebetween. The wetting layer 156 or 256 includes at least one of Co, Ti, or Ta. The metal diffusion blocking layer 154 or 254 has at least one metal nitride layer including at least one of Ti-rich TiN, TaN, or TiN. The stack structure of the metal diffusion blocking layer 154 or 254 and the wetting layer 156 or 256 covering the sidewalls 158SW or 258SW and the bottom surfaces 158BT or 258BT of the metal filling line 158 or 258 can inhibit diffusion of metal ions from the metal filling line 158 or 258, thereby inhibiting the formation of the undesirable voids in the metal gate electrode stack 150, 250A, or 250B.

FIGS. 3A through 3I are cross-sectional views for a method of manufacturing a semiconductor device, according to an embodiment of the present disclosure.

In the embodiments described with reference to FIGS. 3A through 3I, the method of manufacturing the semiconductor device according to the present disclosure is applied to a process for manufacturing a CMOS transistors of a logic device, in particular, to a process for manufacturing the semiconductor device 200 depicted in FIG. 2.

Figure 3A:
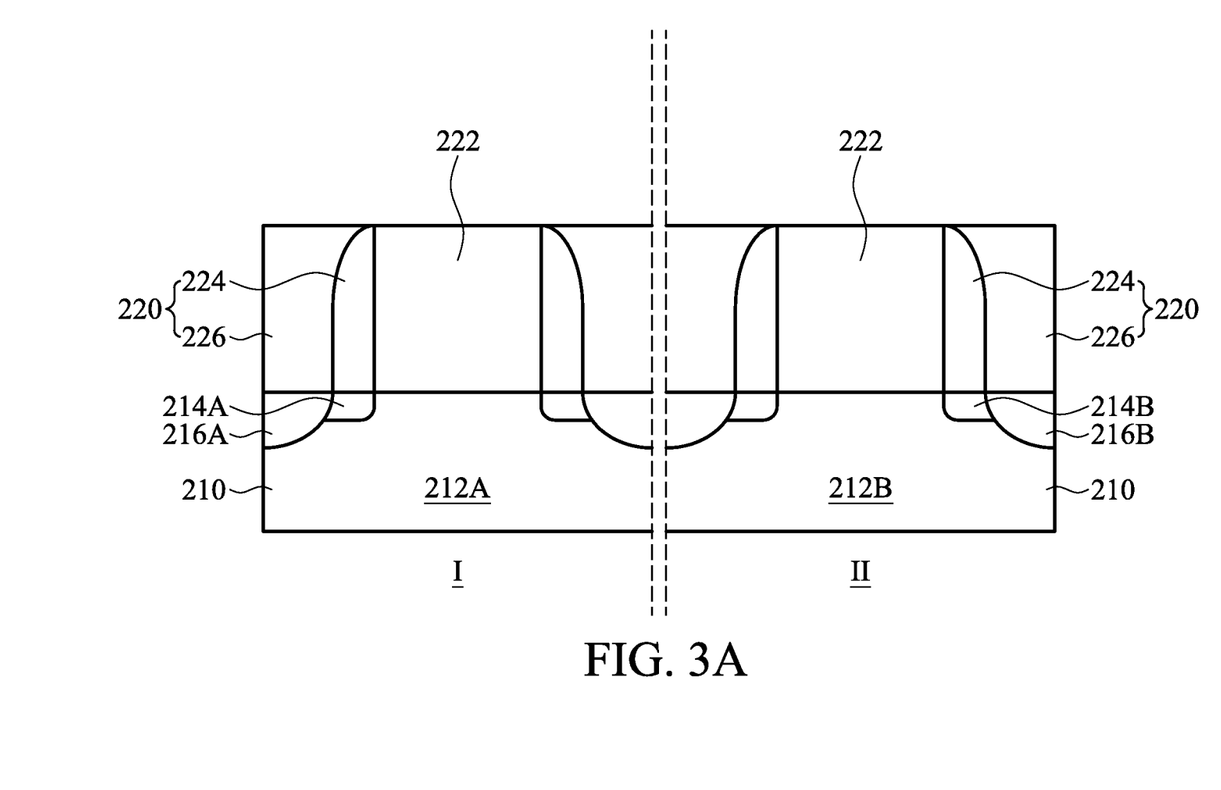
FIGS. 3A-3I are cross-sectional views for a method of manufacturing a semiconductor device according to an embodiment.

Referring to FIG. 3A, an isolation layer (not shown) is formed in the substrate 210 having the first region I and the second region II so as to define a plurality of active areas including the first active area 212A and the second active area 212B. Then, dummy gate patterns 222 are formed on the substrate 210 in the first region I and the second region II. In some embodiments, the first region I and the second region II are divided by the isolation layer (not shown) formed of any one selected from an oxide layer, a nitride layer, or a combination thereof. In some embodiments, the first region I is the NMOS region, and the second region II is the PMOS region. In one or more embodiments, the substrate 210 is formed of silicon, and the dummy gate patterns 222 are formed of polysilicon, although neither of the substrate 210 and the dummy gate patterns 222 is particularly limited thereto.

The insulating spacers 224 are formed to cover sidewalls of each of the dummy gate patterns 222. In some embodiments, the insulating spacers 224 are formed of an oxide layer, a nitride layer, or a combination thereof.

In some embodiments, before the insulating spacers 224 are formed, first ion implantation processes are performed to form the first LDD regions 214A and the second LDD regions 214B in the first active area 212A and the second active area 212B, respectively, by using the dummy gate patterns 222 as first ion implantation masks. After the insulating spacers 224 are formed, second ion implantation processes are performed on the first active area 212A and the second active area 212B, respectively, by using the dummy gate patterns 222 and the insulating spacers 224 as second ion implantation masks. Additionally, an annealing process is performed to form the first source/drain regions 216A and the second source/drain regions 216B in the first active area 212A and the second active area 212B, respectively. During the first and second ion implantation processes, N-type dopant ions are implanted in the first region I in order to form N-type LDD regions and N-type source/drain regions as the first LDD regions 214A and the first source/drain regions 216A, respectively. Additionally, during the first and second ion implantation processes, P-type dopant ions are implanted in the second region II, in order to form P-type LDD regions and P-type source/drain regions as the second LDD regions 214B and the second source/drain regions 216B, respectively.

Then, the insulating patterns 226 are formed in each of a plurality of spaces defined by the insulating spacers 224 between each of the dummy gate patterns 222. In some embodiments, the insulating patterns 226 are formed of silicon oxide or insulating material having a low dielectric constant. In order to form the insulating patterns 226, an insulating material is deposited on the substrate 210 so as to have a thickness sufficient to fill the plurality of spaces defined by the insulating spacers 224 between each of the dummy gate patterns 222, and then a planarization process, such as chemical mechanical polishing (CMP), may be performed thereon until top surfaces of the dummy gate patterns 222 are exposed.

Figure 3B:
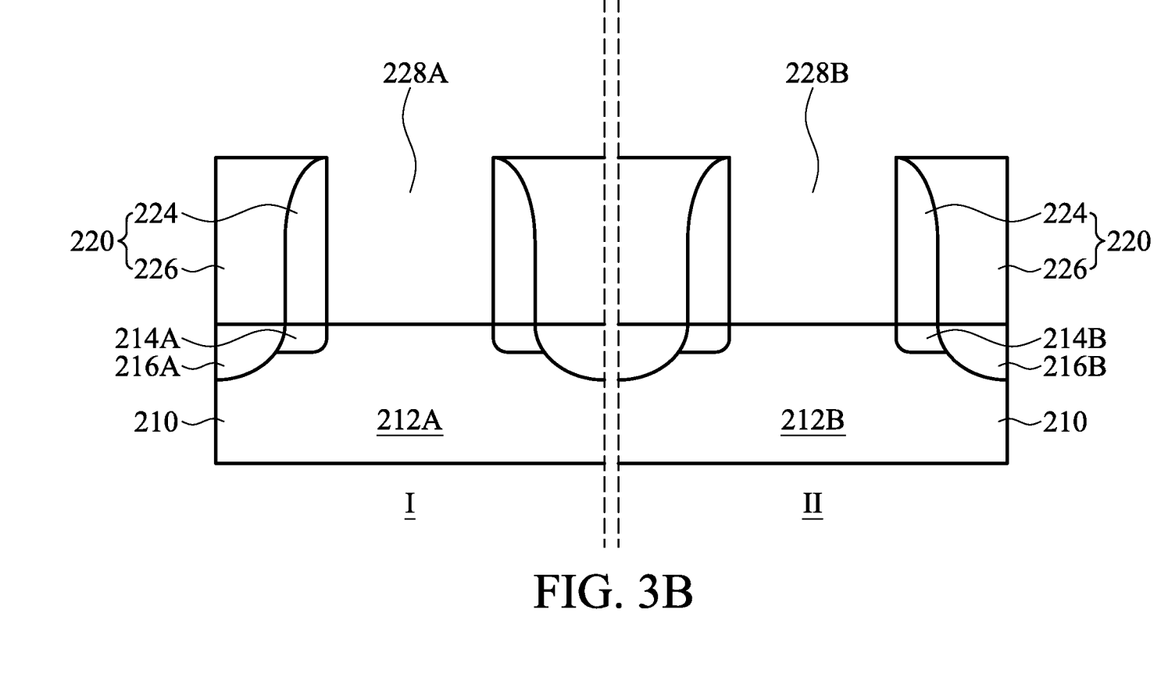

Referring to FIG. 3B, the dummy gate patterns 222 are removed from the first region I and the second region II, so that the first active area 212A and the second active area 212B of the substrate 210 are exposed through the first gate trench 228A and the second gate trench 228B, respectively. In some embodiments, the dummy gate patterns 222 are removed by using a wet etching process.

Figure 3C:
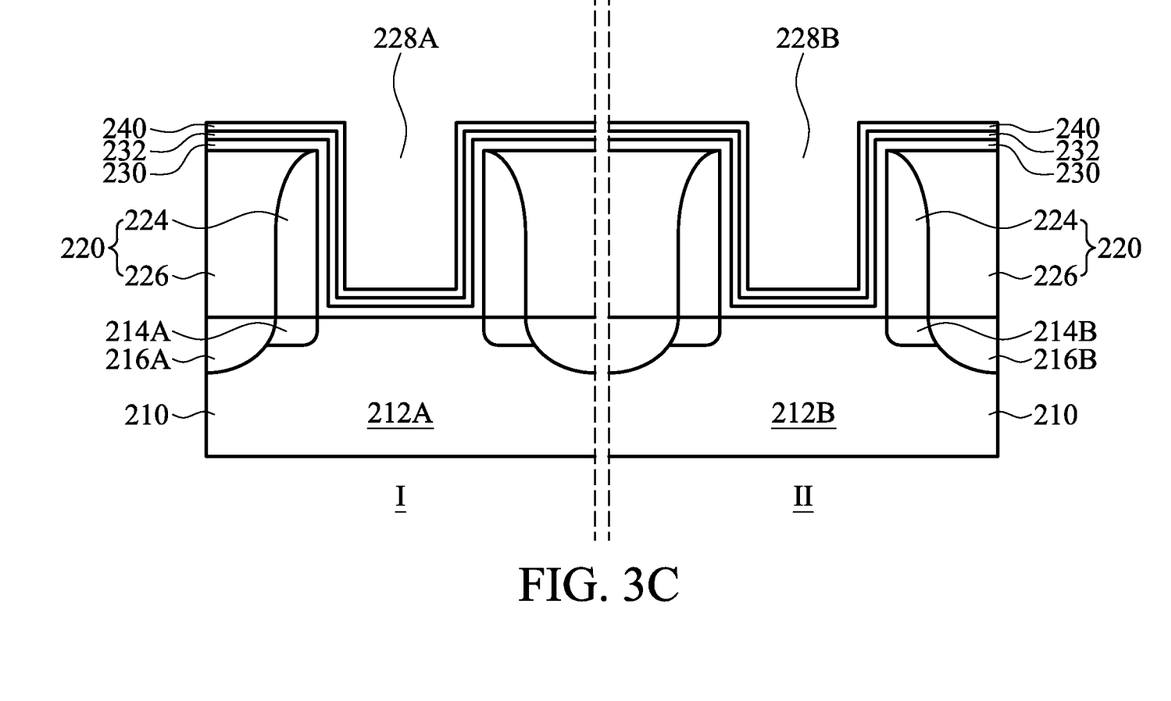

Referring to FIG. 3C, the gate dielectric layer 230 is formed to conformally cover the top surfaces of the first and second active areas 212A and 212B and the sidewalls of the inter-layer dielectric pattern 220 exposed through the first and second gate trenches 228A and 228B, respectively. Then, the capping layer 232 and the barrier layer 240 are sequentially formed on the gate dielectric layer 230.

In one or more embodiments, the gate dielectric layer 230 is formed to have a stack structure of an interfacial dielectric layer, such as a $SiO_2$ layer, and a high-k material layer overlying the interfacial dielectric layer. In some embodiments, the gate dielectric layer 230 is formed by a thermal oxidation process, an atomic layer deposition (ALD) process, a chemical vapor deposition (CVD) process, a physical vapor deposition (PVD) process, or combinations thereof. In some embodiments, the gate dielectric layer 230 is formed to have a thickness in the range of about 1 to 4 nm.

In one or more embodiments, the capping layer 232 is formed to include at least one of metal nitrides such as TiN and TaN, metal carbides such as TaC, and combinations thereof. In some embodiments, the capping layer 232 is formed by an ALD process, a CVD process, a PVD process, or combinations thereof. In some embodiments, the capping layer 232 is formed to have a thickness in the range of about 1 to 5 nm.

In one or more embodiments, the barrier layer 240 is formed to comprise at least one conductive barrier material selected from metals or metal nitrides. In some embodiments, the barrier layer 240 includes at least one conductive barrier material selected from TiN, TaN, TaC, or WN, but is not limited by the above-mentioned materials. In some embodiments, the barrier layer 240 is formed by an ALD process, a CVD process, a PVD process, or combinations thereof. In some embodiments, the barrier layer 240 is formed to have a thickness in the range of about 1 to 5 nm.

Figure 3D:
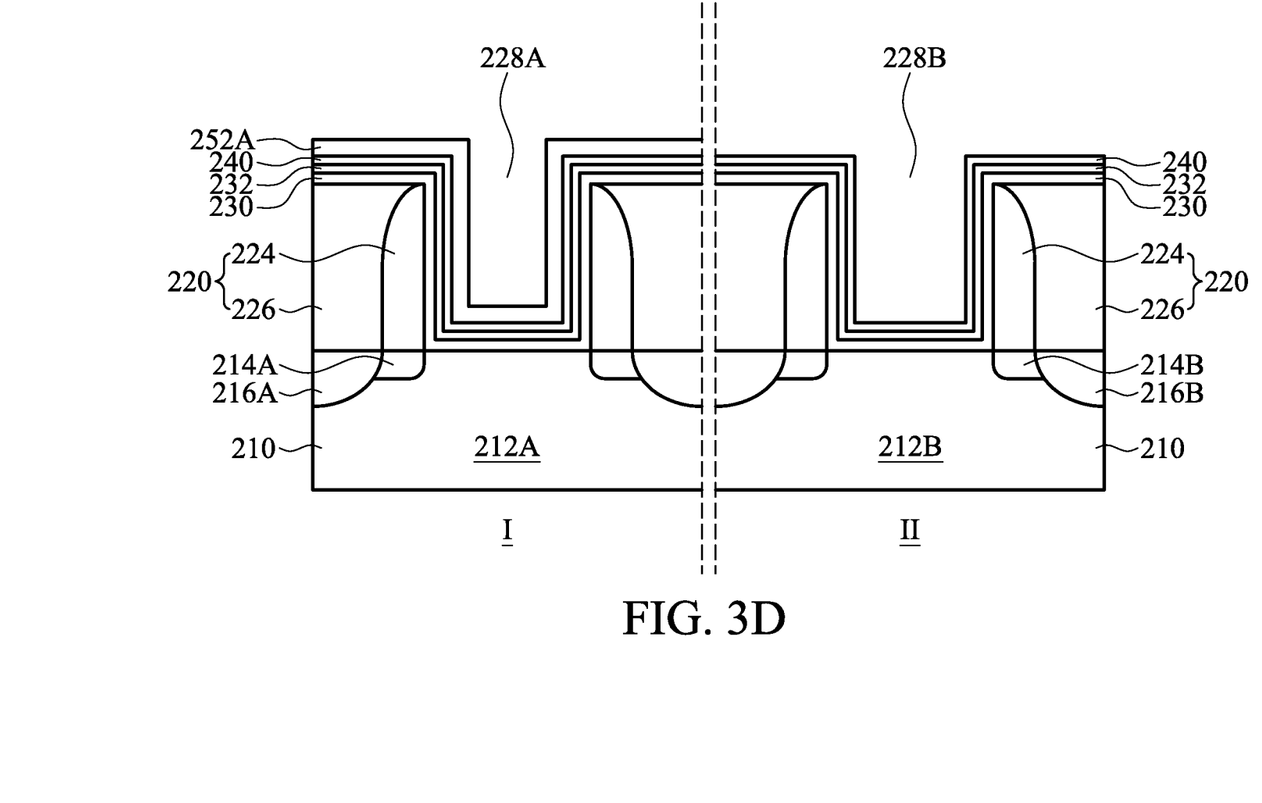

Referring to FIG. 3D, the first work function layer 252A is formed on the barrier layer 240 in the first region I. In the case of forming an NMOS transistor in the first region I, the first work function layer 252A is formed to comprise at least one of Ti, Al, or TiAl. In some embodiments for forming the first work function layer 252A in the first region I, blanket deposition of metallic material for forming a first metallic layer is performed on the entire exposed top surface of the resultant structure on which the barrier layer 240 is formed. Then, an unnecessary portion of the first metallic layer is removed from the substrate 210 by using a suitable etch mask layer (not shown) covering a portion of the first metallic layer to leave the first work function layer 252A resulting from the portion of the first metallic layer in the first region I. In some embodiments, the first work function layer 252A is formed by an ALD process, a CVD process, a PVD process, or combinations thereof. In some embodiments, the first work function layer 252A is formed to have a thickness in the range of about 1 to 10 nm.

Figure 3E:
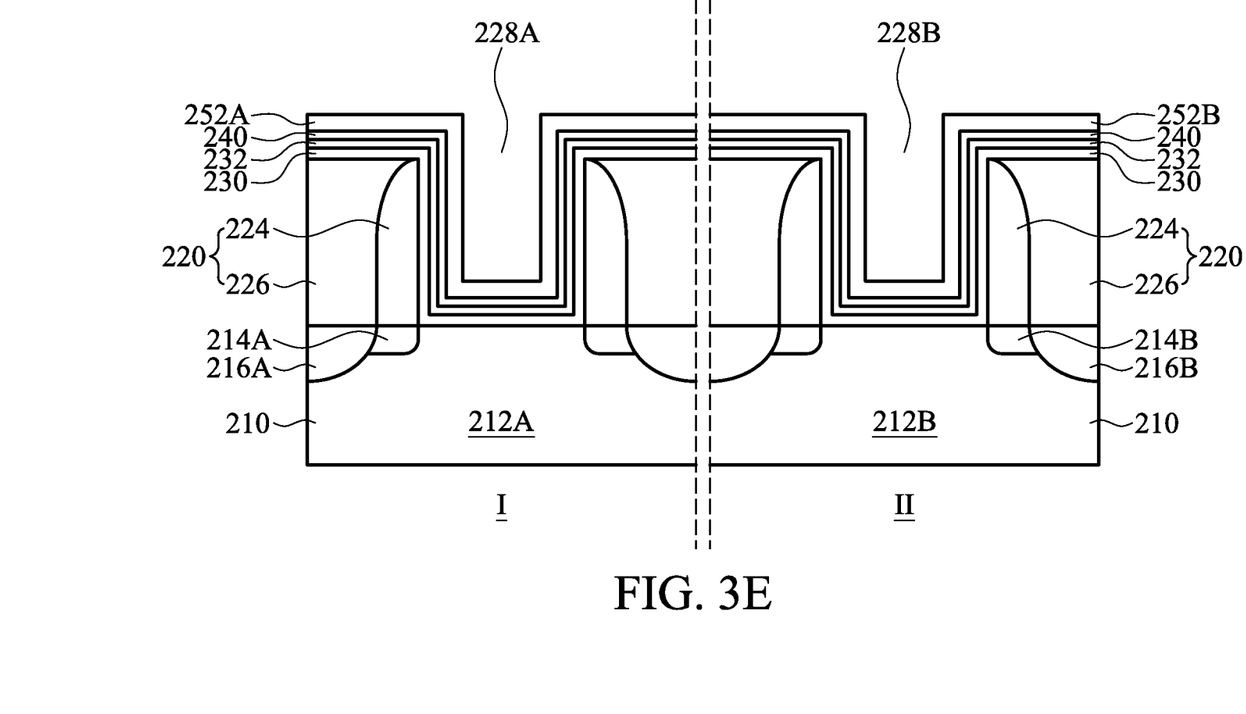

Referring to FIG. 3E, the second work function layer 252B is formed on the barrier layer 240 in the second region II. In the case of forming a PMOS transistor in the second region II, the second work function layer 252B is formed to comprise at least one of TiN, Co, WN, or TaC. In some embodiments for forming the second work function layer 252B in the second region II, blanket deposition for forming a second metallic layer is performed on the entire exposed top surface of the resultant structure on which the first work function layer 252A and the barrier layer 240 are exposed in the first region I and the second region II, respectively. Then, an unnecessary portion of the second metallic layer is removed from the substrate 210 by using a suitable etch mask layer (not shown) covering a portion of the second metallic layer to leave the second work function layer 252B resulting from the portion of the second metallic layer in the second region II. In some embodiments, the second work function layer 252B is formed by an ALD process, a CVD process, a PVD process, or combinations thereof. In some embodiments, the second work function layer 252B is formed to have a thickness in the range of about 1 to 10 nm.

In the exemplified embodiment described above with reference to FIGS. 3D and 3E, the first work function layer 252A is formed before the formation of the second work function layer 252B. However, the first work function layer 252A may be formed after the formation of the second work function layer 252B, in accordance with the spirit and scope of embodiment of the disclosure.

Figure 3F:
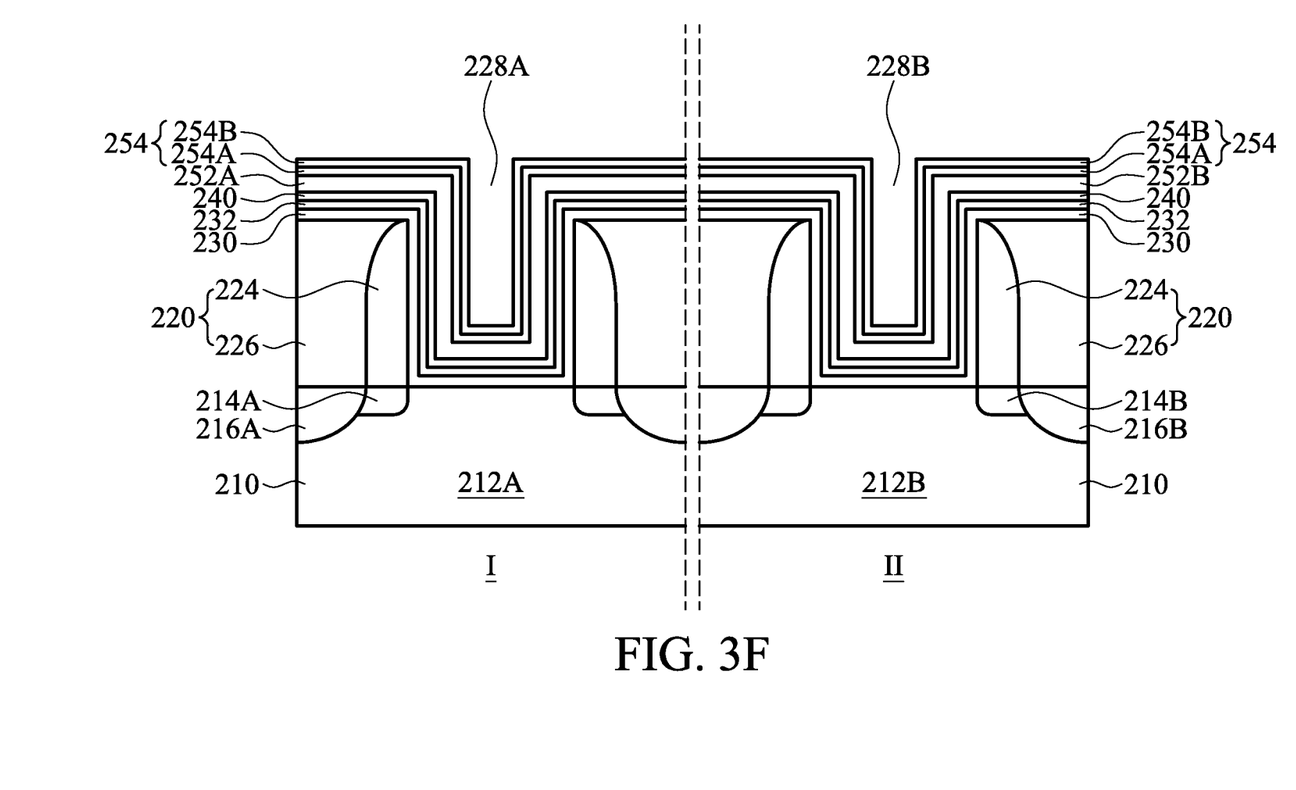

Referring to FIG. 3F, the metal diffusion blocking layer 254 is formed on the first work function layer 252A and the second work function layer 252B in the first region I and the second region II. The metal diffusion blocking layer 254 is formed to have the stack structure of the first metal nitride layer 254A and the second metal nitride layer 254B. In some embodiments, the metal diffusion blocking layer 254 is formed to have a stack structure of a TiN layer and a Ti-rich TiN layer as the stack structure of the first metal nitride layer 254A and the second metal nitride layer 254B. Alternatively, the metal diffusion blocking layer 254 is formed to have a stack structure of a TiN layer and a TaN layer as the stack structure of the first metal nitride layer 254A and the second metal nitride layer 254B. In some embodiments, each of the first metal nitride layer 254A and the second metal nitride layer 254B of the metal diffusion blocking layer 254 is formed by an ALD process, a CVD process, a PVD process, or combinations thereof. In some embodiments, each of the first metal nitride layer 254A and the second metal nitride layer 254B of the metal diffusion blocking layer 254 is formed to have thicknesses in the range of about 1 to 5 nm.

Figure 3G:
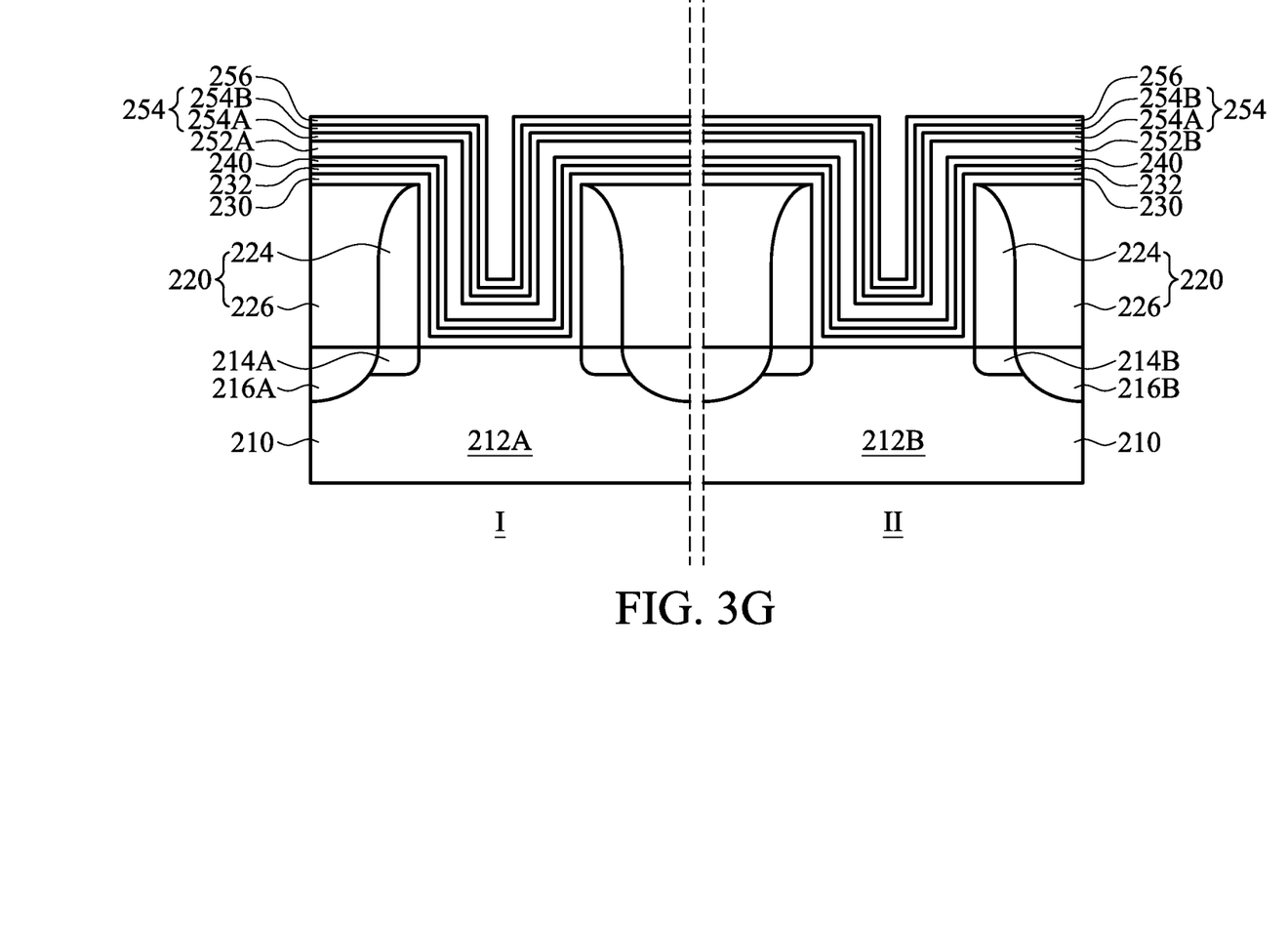

Referring to FIG. 3G, the wetting layer 256 is formed on the metal diffusion blocking layer 254 in the first region I and the second region II. The wetting layer 256 is formed to include at least one of Co, Ti, or Ta. In one or more embodiments, the wetting layer 256 is formed by a CVD process, although not particularly limited thereto. In some embodiments, the wetting layer 256 is formed to have a thickness in the range of about 1 to 5 nm.

Figure 3H:
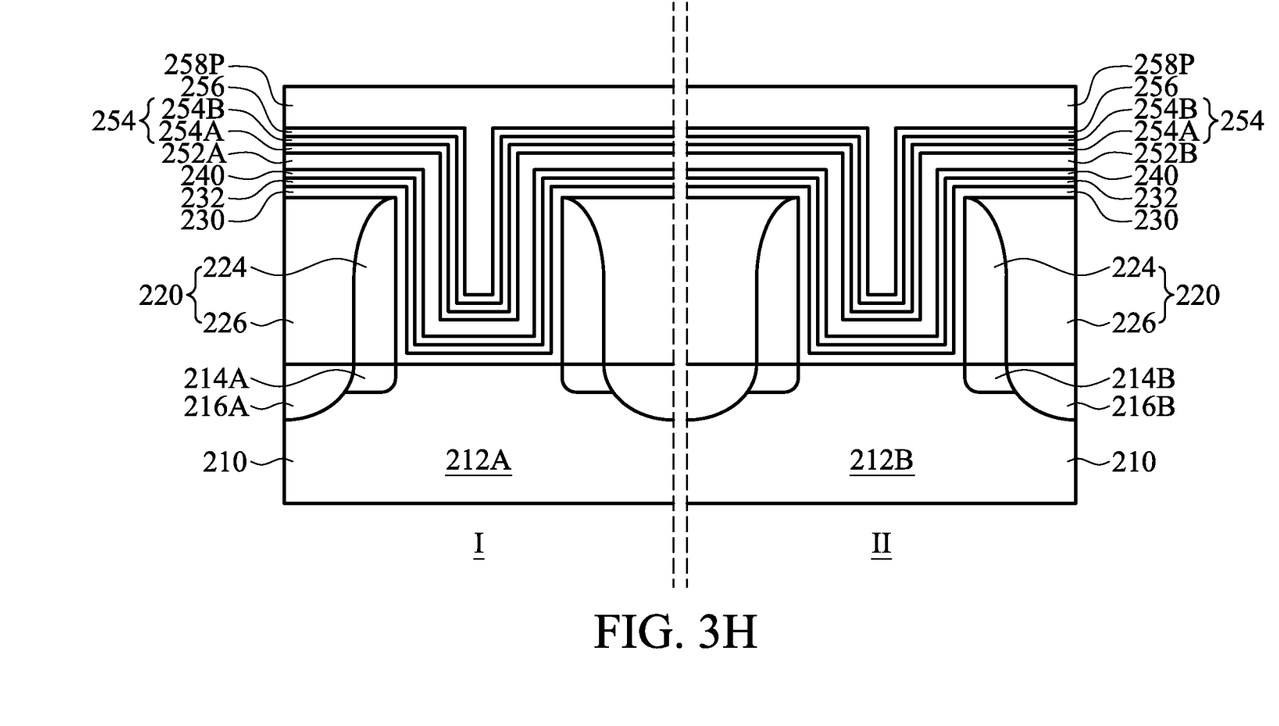

Referring to FIG. 3H, a metal filling layer 258P is formed to have a thickness sufficient to fill the first gate trench 228A and the second gate trench 228B on the wetting layer 256 in the first region I and the second region II. In some embodiments, the metal filling layer 258P is formed to comprise at least one of Al, Cu, or AlCu, but is not limited by the above-mentioned materials. In some embodiments, the metal filling layer 258P is formed by a PVD process, although not particularly limited thereto. After the remainder of the first gate trench 228A and the second gate trench 228B is filled with the metal filling layer 258P on the wetting layer 256, the resultant structure having the metal filling layer 258P is thermally treated at a temperature sufficiently high enough to cause reflow of the metal filling layer 258P, for example at a temperature of about 300-600° C. By the reflow process as described above, materials of the metal filling layer 258P can flow within the first gate trench 228A and the second gate trench 228B, thereby promoting complete filling of the first gate trench 228A and the second gate trench 228B without voids.

Figure 3I:
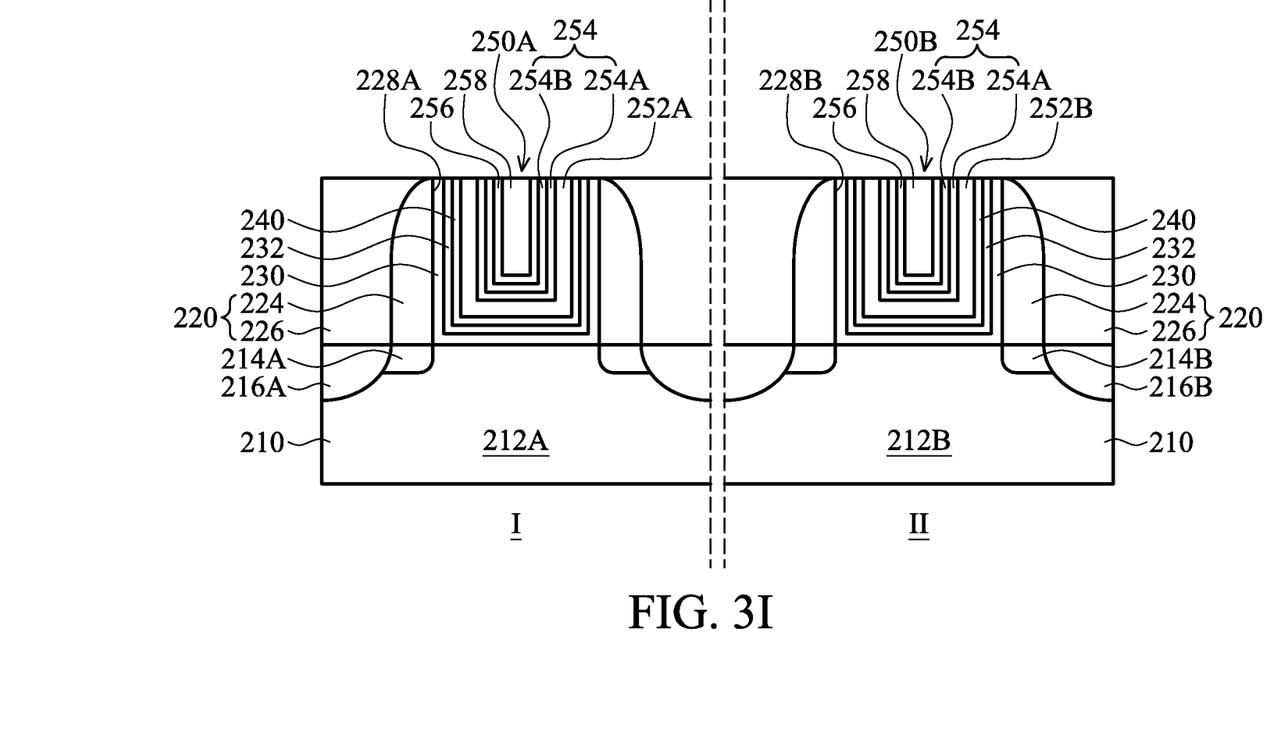

Referring to FIG. 3I, the resultant structure of FIG. 3H is planarized by using a CMP process until a top surface of the inter-layer dielectric pattern 220 is exposed in the first region I and the second region II, to form the metal filling lines 258 resulting from portions of the metal filling layer 258P within the first gate trench 228A and the second gate trench 228B, respectively.

According to one or more embodiments described with reference to FIGS. 3A through 3I, in forming the first and second metal gate electrode stacks 250A and 250B, the metal diffusion blocking layer 254, the wetting layer 256, and the metal filling line 258 are sequentially formed over the gate dielectric layer 230 within the first and second gate trenches 228A and 228B, respectively. The stack structure of the metal diffusion blocking layer 254 and the wetting layer 256 formed to cover the sidewalls 258SW and the bottom surfaces 258BT of the metal filling line 258 can inhibit diffusion of metal ions from the metal filling line 258, thereby inhibiting the formation of the undesirable voids in the first and second metal gate electrode stacks 250A and 250B.

According to some embodiments, a semiconductor device comprises a substrate, a gate dielectric layer on the substrate, and a gate electrode stack on the gate dielectric layer. The gate electrode stack includes a metal filling line, a wetting layer, a metal diffusion blocking layer, and a work function layer. The wetting layer is in contact with a sidewall and a bottom surface of the metal filling line. The metal diffusion blocking layer is in contact with the wetting layer and covers the sidewall and the bottom surface of the metal filling line with the wetting layer therebetween. The work function layer covers the sidewall and the bottom surface of the metal filling line with the wetting layer and the metal diffusion blocking layer therebetween.

According to some embodiments, a semiconductor device comprises a substrate having a first active area and a second active area, an inter-layer dielectric pattern defining a first gate trench on the first active area and a second gate trench on the second active area, and a first MOS transistor including a first gate electrode stack within the first gate trench. The first gate electrode stack includes a first metal filling line, a first wetting layer, a first metal diffusion blocking layer, and a first work function layer. The first wetting layer is in contact with a sidewall and a bottom surface of the first metal filling line. The first metal diffusion blocking layer is in contact with the first wetting layer and covers the sidewall and the bottom surface of the first metal filling line with the first wetting layer therebetween. The first work function layer covers the sidewall and the bottom surface of the first metal filling line with the first wetting layer and the first metal diffusion blocking layer therebetween.

According to some embodiments, a method of manufacturing a semiconductor device comprises forming an inter-layer dielectric pattern on a substrate having a first active area and a second active area. The inter-layer dielectric pattern is formed to define gate trenches through which the first active area or the second active area is exposed. A gate dielectric layer is formed on the first and second active areas and on surfaces of the inter-layer dielectric pattern within the gate trenches. Gate electrode stacks are formed to fill the gate trenches on the gate dielectric layer. In order to form the gate electrode stacks, a first work function layer is formed over the gate dielectric layer formed on the first active area. A metal diffusion blocking layer is formed on the first work function layer. A wetting layer is formed on the metal diffusion blocking layer. A metal filling layer is formed on the wetting layer.

While the present disclosure has been particularly shown and described with reference to example embodiments thereof, a skilled person in the art will appreciate that there can be many embodiment variations of this disclosure. Although the embodiments and their features have been described in detail, it should be understood that various changes, substitutions and alterations can be made herein without departing from the spirit and scope of the embodiments.

The above method embodiment shows exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within scope of the disclosure and will be apparent to those skilled in the art after reviewing this disclosure.

What is claimed is:
1. A semiconductor device, comprising:
a substrate;
a gate dielectric layer on the substrate, wherein the gate dielectric layer comprises a single metal oxide layer;
a gate electrode stack on the gate dielectric layer, the gate electrode stack including:
a metal filling line;
a wetting layer being in contact with a sidewall and a bottom surface of the metal filling line;
a metal diffusion blocking layer being in contact with the wetting layer and covering the sidewall and the bottom surface of the metal filling line with the wetting layer therebetween; and
a work function layer covering the sidewall and the bottom surface of the metal filling line with the wetting layer and the metal diffusion blocking layer therebetween, wherein the work function layer includes TaC;
a capping layer in contact with the gate dielectric layer between sidewalls of the gate dielectric layer and sidewalls of the work function layer, wherein the capping layer comprises TaC and at least one of TiN or TaN;
a barrier layer interposed between the capping layer and the sidewalls of the work function layer, wherein the barrier layer comprises TaC and WN and is in contact with the capping layer; and an inter-layer dielectric pattern surrounding the gate electrode stack, the inter-layer dielectric pattern comprising:

an insulating pattern surrounding the sidewalls of the work function layer; and an insulating spacer between the insulating pattern and the work function layer.

2. The semiconductor device of claim 1, wherein the wetting layer includes at least one of Co, Ti, or Ta.

3. The semiconductor device of claim 1, wherein the metal diffusion blocking layer has at least one metal nitride layer including at least one of TaN or TiN.

4. The semiconductor device of claim 1, wherein the metal diffusion blocking layer has a stack structure of a first metal nitride layer including TiN and a second metal nitride layer including at least one of Ti-rich TiN or TaN.

5. The semiconductor device of claim 1, wherein the metal filling line includes at least one of Al, Cu, AlCu, or W.

6. The semiconductor device of claim 1, wherein a thickness of the metal diffusion blocking layer ranges from about 1 nm to about 5 nm.

7. The semiconductor device of claim 1, further comprising source and drain regions in the substrate under the insulating pattern.

8. A semiconductor device, comprising:

a substrate having a first active area and a second active area;

an inter-layer dielectric pattern defining a first gate trench on the first active area and a second gate trench on the second active area;

a first metal oxide semiconductor (MOS) transistor including a first gate electrode stack within the first gate trench, the first gate electrode stack including:

a first metal filling line;

a first wetting layer being in contact with a sidewall and a bottom surface of the first metal filling line;

a first metal diffusion blocking layer being in contact with the first wetting layer and covering the sidewall and the bottom surface of the first metal filling line with the first wetting layer therebetween;

a first work function layer covering the sidewall and the bottom surface of the first metal filling line with the first wetting layer and the first metal diffusion blocking layer therebetween, wherein the first work function layer includes TaC;

a barrier layer covering a sidewall and a bottom surface of the first work function layer, wherein the barrier layer comprises TaC and WN;

a capping layer covering a sidewall and a bottom surface of the barrier layer, wherein the barrier layer is between the sidewall of the first work function layer and a sidewall of the capping layer, and the capping layer comprises TaC and at least one of TiN or TaN and is in contact with the barrier layer, a gate dielectric layer covering the sidewall and a bottom surface of the capping layer, wherein the gate dielectric layer comprises one metal oxide layer composed of a single layer, and the inter-layer dielectric pattern comprises:

an insulating pattern surrounding the sidewall of the first work function layer; and an insulating spacer between the insulating pattern and the first work function layer.

9. The semiconductor device of claim 8, wherein
the first wetting layer includes at least one of Co, Ti, or Ta, and
the first metal diffusion blocking layer has at least one metal nitride layer including at least one of TaN or TiN.

10. The semiconductor device of claim 8, wherein the first metal filling line includes at least one of Al, Cu, AlCu, or W.

11. The semiconductor device of claim 8, further comprising:

a second MOS transistor including a second gate electrode stack within the second gate trench, the second gate electrode stack including:

a second metal filling line;

a second wetting layer being in contact with a sidewall and a bottom surface of the second metal filling line;

a second metal diffusion blocking layer being in contact with the second wetting layer and covering the sidewall and the bottom surface of the second metal filling line with the second wetting layer therebetween; and a second work function layer covering the sidewall and the bottom surface of the second metal filling line with the second wetting layer and the second metal diffusion blocking layer therebetween.

12. The semiconductor device of claim 8, wherein the first metal diffusion blocking layer comprises:

a first nitride layer; and a second nitride layer having a different composition from the first nitride layer.

13. A semiconductor device comprising:

a first gate structure on a substrate, the first gate structure comprising:

a first gate dielectric layer on the substrate, wherein a dielectric constant of the first gate dielectric layer is substantially uniform across a thickness direction of the first gate dielectric layer, and the first gate dielectric layer directly contacts the substrate;

a first capping layer directly on the first gate dielectric layer;

a first barrier layer on the first capping layer, wherein the first capping layer is between sidewalls of the first barrier layer and sidewalls of the first gate dielectric layer;

a first work function layer on the first barrier layer, wherein the first work function layer comprises at least one of titanium, aluminum or titanium aluminum;

a first metal diffusion blocking layer on the first work function layer;

a first wetting layer on the first metal diffusion blocking layer; and a first filling line on the first wetting layer;

a second gate structure on the substrate, the second gate structure comprising:

a second gate dielectric layer on the substrate;

a second capping layer directly on the second gate dielectric layer, wherein the second capping layer comprises TaC and at least one of TiN or TaN;

a second barrier layer directly on the second capping layer, wherein the second barrier layer comprises TaC and WN;

a second work function layer on the second gate dielectric layer, the second work function layer comprising a different material from the first work function layer;

a second wetting layer on the second work function layer, the second work function layer comprising a same material as the first wetting layer; and a second filling line on the second wetting layer; and an inter-layer dielectric pattern between the first gate structure and the second gate structure, the inter-layer dielectric pattern comprising:

an insulating pattern surrounding sidewalls of the first work function layer; and an insulating spacer between the insulating pattern and the first work function layer.

14. The semiconductor device of claim 13, wherein a thickness of the first and second wetting layers ranges from 1 nanometer (nm) to 5 nm.

15. The semiconductor device of claim 13, wherein the second gate structure comprises a second metal diffusion blocking layer, the second metal diffusion blocking layer comprising:

a first nitride layer; and a second nitride layer having a different composition from the first nitride layer.

16. The semiconductor device of claim 13, wherein the first gate dielectric layer consists of a single layer.

17. The semiconductor device of claim 13, wherein the first gate dielectric layer covers a sidewall surface and a bottom surface of the first work function layer, the first work function layer covers a sidewall surface and a bottom surface of the first wetting layer and the first wetting layer covers a sidewall surface and a bottom surface of the first filling line, and the second gate dielectric layer covers a sidewall surface and a bottom surface of the second work function layer, the second work function layer covers a sidewall surface and a bottom surface of the second wetting layer and the second wetting layer covers a sidewall surface and a bottom surface of the second filling line.

* * * * *